(12) United States Patent
Nihei

(10) Patent No.: US 6,903,365 B1
(45) Date of Patent: Jun. 7, 2005

(54) ELECTRONIC DEVICE USING CARBON ELEMENT LINEAR STRUCTURE AND PRODUCTION METHOD THEREOF

(75) Inventor: Mizuhisa Nihei, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/463,796

(22) Filed: Jun. 18, 2003

(30) Foreign Application Priority Data

Jun. 25, 2002 (JP) ........................................ 2002-184823
Jul. 3, 2002 (JP) ........................................ 2002-194898

(51) Int. Cl.⁷ .............................................. H01L 29/72
(52) U.S. Cl. .............................. 257/14; 257/1; 257/741; 257/773
(58) Field of Search .............................. 257/1, 14, 741, 257/773

(56) References Cited

U.S. PATENT DOCUMENTS

2003/0211724 A1 * 11/2003 Haase ........................ 438/629

* cited by examiner

*Primary Examiner*—Edward Wojciechowicz
(74) *Attorney, Agent, or Firm*—Westerman Hattori Daniels & Adrian, LLP

(57) ABSTRACT

An electronic device utilizing electric conduction generated by the movement of electrons or positive holes of a semiconductor, includes a semiconductor member or members, a conductive member or members and an insulating member or members, the electronic device comprising a member or members formed of a metal silicide as the conductive member or members, and a carbon element linear structure or structures connected to the member or members formed of the conductive silicide. A production method of such an electronic device is also disclosed.

7 Claims, 5 Drawing Sheets

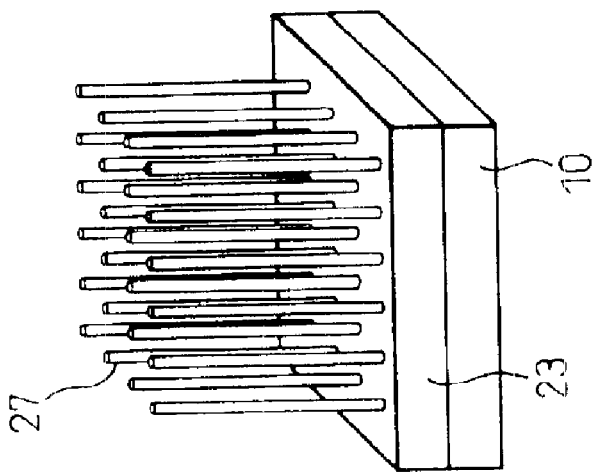
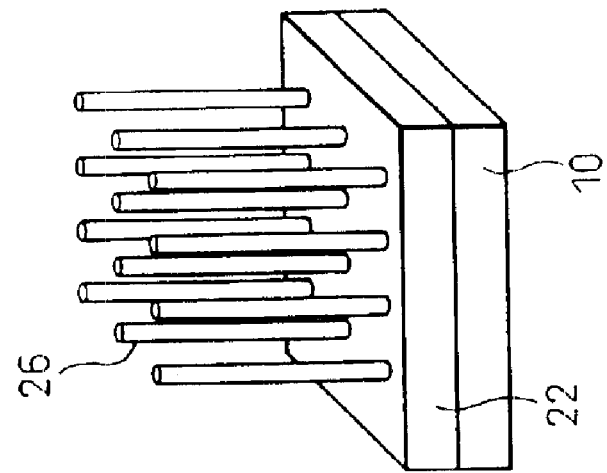
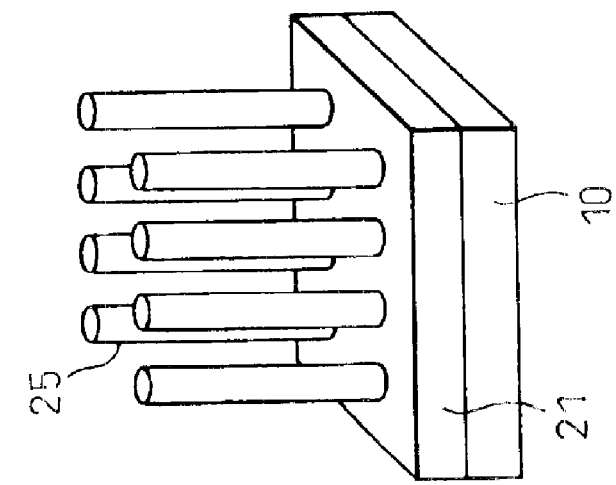

ELECTRONIC DEVICE USING CARBON ELEMENT LINEAR STRUCTURE AND PRODUCTION METHOD THEREOF

CROSS-REFERENCES TO RELATED APPLICATIONS

This application is based upon and claims the benefit of priority from each of prior Japanese Patent Application No. 2002-184823, filed on Jun. 25, 2002, and Application No. 2002-194898, filed on Jul. 3, 2002, the entire contents thereof being incorporated herein by reference.

BACKGROUND OF THE INVENTION

1. Field of the Invention

This invention relates to an electronic device using a carbon element linear structure typified by a carbon nano-tube and a production method thereof. More particularly, the invention relates to an electronic device having a fine structure using as its constituent element a carbon element linear structure that is expected to be a break-through in the miniaturization of Si technology, and a production method thereof.

2. Description of the Related Art

One of the important technologies in production of electronic devices is a Si technology. However, miniaturization by a top-down system in photolithography in the Si technology involves a limit, and expectations have been increasing for carbon nano-tubes and carbon fibers (carbon nano-fibers) the application of which has been proposed to constitute a fine structure by a bottom-up system in future.

To form carbon nano-tubes in a desired region on a substrate for producing an electronic device, a method has been employed that arranges a catalyst metal film, necessary for growing the carbon nano-tubes, at a desired position and then grows the carbon nano-tubes on the catalyst metal by use of a thermal CVD method or a plasma CVD method.

An element such as Ni, Fe or Co, or alloys containing these elements, are used as the catalyst metals for growing the carbon nano-tubes. For example, as shown in FIG. 1, a Ni film 12 (having a thickness of about 100 nm) deposited onto a Si substrate 10 is used as the catalyst, and the carbon nano-tubes 14 grow with an aggregation of the Ni atoms of the film 12 as the nucleus of the growth.

When the carbon nano-tubes 14 are allowed to grow with the Ni film 12 as the catalyst, the Ni amounts at the growth nuclei of the carbon nano-tubes are not constant (variation occurs at each growth nucleus) because a greater amount of Ni of the film 12 exists than the amount required for the growth of the carbon nano-tubes. In consequence, non-uniformity of the diameters of the carbon nano-tubes occurs as shown in FIG. 1.

Non-uniformity of the diameters of the carbon nano-tubes might govern performance of the electronic device fabricated by utilizing the carbon nano-tubes. For example, carbon nano-tubes having properties analogous to those of semiconductors have a band gap dependent on the diameter. When the carbon nano-tubes have semiconductor-like properties and non-uniform diameters, the characteristics of the electronic device are unstable.

SUMMARY OF THE INVENTION

It is an object of the invention to provide an electronic device using carbon nano-tubes having a uniform diameter, and a production method thereof.

To grow the carbon nano-tube by a CVD method, a film of a catalyst metal such as Ni, Co, Fe, etc, is generally used, and the growth of the nano-tubes proceeds with the catalyst metal of the film as the nucleus of the growth. The semiconductor devices according to the invention include carbon nano-tubes grown not only by using a pure metal film of Ni, Co, Fe, etc, but also a film formed of a silicide of such a metal as the catalyst film for growing the carbon nano-tubes, with the metal constituting a part of the film as the nucleus of the growth. The semiconductor device of the invention also contains the metal silicide film as a conductive member for constituting the semiconductor device.

The material known as a carbon nano-tube is a linear nano-structure having a cylindrical shape formed by winding a graphite sheet, in which carbon atoms are assembled into six-member rings with the strongest bond of the carbon atoms of sp2, into a cylinder, and having a minimum diameter of 0.4 nm. Two types of carbon nano-tubes exist; one exhibiting semiconductor properties and the other exhibiting metallic properties. The invention can use both types of carbon nano-tubes. A single-wall tube having a single cylindrical body and a multi-wall tube having a plurality of concentric cylindrical bodies are known, and the invention can also use both of them.

Besides the carbon nano-tubes, structures called, for example, a cup stack type structure and a carbon fiber are also known as similar linear nano-structures constituted by the carbon atoms. The invention can use all of them, and they are generically called a "carbon element linear structure".

Therefore, the electronic device according to the invention is a device, such as a transistor, that utilizes electric conduction created by the movement of electrons or positive holes of semiconductor, and comprises a semiconductor member or members, a conductive member or members, an insulating member or members, the conductive member or members including a member formed of a metal silicide, and a carbon element linear structure or structures connected to the member formed of the metal silicide.

The electronic device according to the invention can be produced by a production method for producing electronic devices that utilize electric conduction created by the movement of electrons or positive holes of semiconductor, and comprises a semiconductor member or members, a conductive member or members and an insulating member or members, the production method including the steps of forming a metal silicide layer as the conductor member, and growing a carbon element linear structure from this metal silicide layer by the CVD method.

BRIEF DESCRIPTION OF THE DRAWINGS

FIGS. 2A to 2C are views illustrating the growth of carbon nano-tubes using a Ni silicide film as a catalyst;

DETAILED DESCRIPTION OF THE INVENTION

Figure 1:
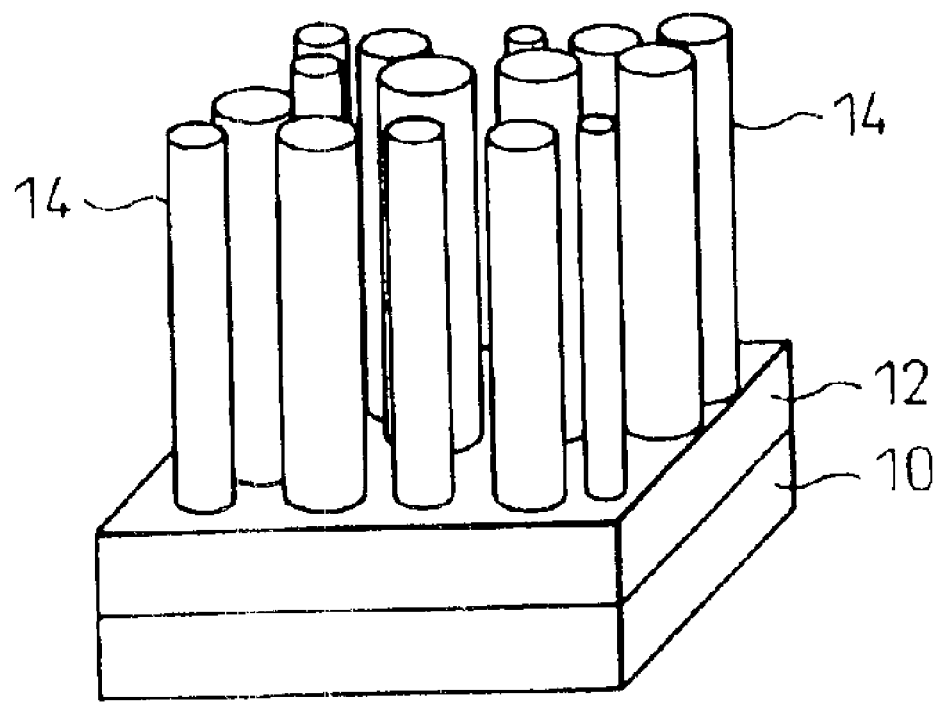
FIG. 1 is a perspective view illustrating the growth of carbon nano-tubes using a Ni film as a catalyst.

The present invention will be hereinafter explained regarding electronic devices using carbon nano-tubes as a carbon element linear structures by way of example.

FIGS. 2A to 2C schematically show examples where carbon nano-tubes are grown by a CVD process by use of a Ni silicide film on a silicon substrate as a catalyst. In all cases, a Ni silicide film is first formed in a desired region on each Si substrate 10. These Ni silicide films are formed by the steps of depositing a Ni film on the Si substrate 10, and treating the Ni film for 30 seconds in accordance with an RTA (Rapid Thermal Annealing) process. Here, a Ni film 21 (FIG. 2A) having a composition of $Ni_2Si$, a Ni film 22 (FIG. 2B) having a composition of NiSi and a Ni film 23 (FIG. 2C) having a composition of $NiSi_2$ are mainly formed at treatment temperatures of within the ranges of 250 to 450° C., 450 to 750° C. and 750° C. or above, respectively.

Next, the carbon nano-tubes 25, 26 and 27 are allowed to grow using a plasma CVD process using a mixed gas of methane and hydrogen with the Ni element constituting the Ni silicide films 21, 22 and 23 as the catalyst. The sizes of the growth nuclei of the carbon nano-tubes vary at this time depending on the Ni composition ratio of the Ni silicides, and the diameters of the carbon nano-tubes vary accordingly. More specifically, the Ni composition ratio of the silicide becomes smaller with a higher RTA treatment temperature, and the diameters of the carbon nano-tubes become smaller. This is presumably because when the amount of Ni at the surface of the Ni silicide is small, the growth proceeds under the condition controlled by the amount of usable Ni catalyst. If the Ni silicide composition ratio is uniform in this case, the diameters of the carbon nano-tubes become uniform.

Figure 3:
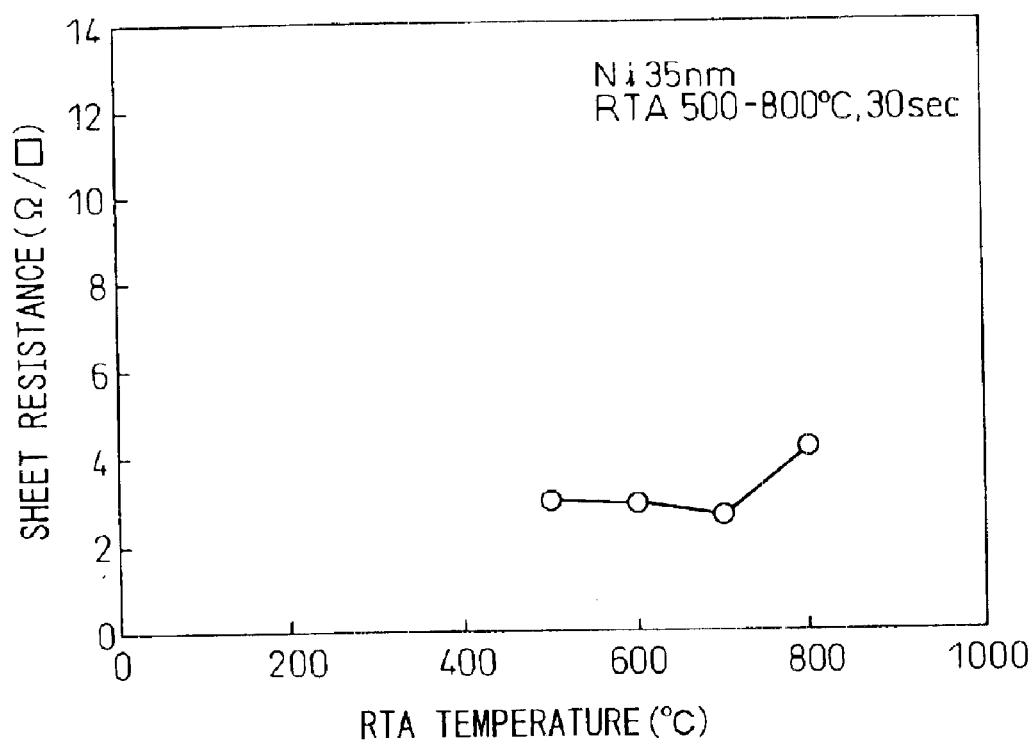
FIG. 3 is a graph showing the relation between a sheet resistance of a Ni silicide layer obtained by an RTA treatment of a Ni layer and an RTA treatment temperature.

FIG. 3 shows the relation between the sheet resistance of the Ni silicide layer obtained by subjecting a 35 nm-thick Ni layer to the RTA treatment and the RTA treatment temperature. It can be understood from the graph that NiSi having a low resistance is formed within the range of 500 to 700° C. and $NiSi_2$ having a high resistance is formed at 800° C. Incidentally, the sheet resistance of the 35 nm-thick Ni layer is 12 Ω/square. When the Ni silicide layer is required to have a low resistance in the electronic device to be produced, for example, the RTA treatment of the Ni layer must be carried out at a temperature of 450 to 750° C. Similarly, the growing temperature of the carbon nano-tubes by the plasma CVD process as the subsequent process step must also be 750° C. or below.

When the Ni silicide layer need not have a low resistance (such as when it is used as an electrode), for example, it is possible to carry out the RTA treatment at 750° C. or above and to reduce the diameters of the carbon nano-tubes.

When cobalt (Co) is used as the catalyst metal, a Co silicide is similarly formed, and the carbon nano-tubes are formed with the Co silicide as the catalyst. Unlike the Ni silicide, there is no limitation to the RTA temperature and to the carbon nano-tube growing temperature because the resistance of $CoSi_2$ formed at 800° C. or above is low. It is possible to use a process in which a Co-rich silicide such as CoSi is formed at the RTA temperature of 800° C. or below and the carbon nano-tubes are then grown at 800° C. or above, to thereby form the carbon nano-tubes and to simultaneously convert the silicide to a low resistance $CoSi_2$ layer.

Besides the method that applies heat-treatment such as RTA to the metal layer such as Ni on the Si substrate to allow Si to react with the metal, arbitrary methods can also be employed to form the metal silicide. For example, a metal ion implantation method can be utilized. In this case, an ion acceleration voltage of 100 keV, a dose of $1\times10^{17}\,cm^{-2}$, and an RTA temperature of 850 to 950° C. are used as the conditions to implant ions into the Si substrate, whereby diffusion of the implanted element occurs and the element reacts with Si of the substrate to form the metal silicide layer. This ion implantation method can acquire a silicide having a smaller Ni composition ratio than that of the silicide formed from the metal film. Therefore, miniaturization of the carbon nano-tube diameter can be accomplished, and this method will be employed in future as a method of forming single-wall carbon nano-tubes.

It is also possible to employ a method for forming a predetermined metal silicide layer by serially depositing an Si element film and a metal element film on a sapphire substrate, for example, and then conducting the RTA treatment, without using the Si substrate. Further, formation of the metal silicide layer by a CVD process or a PVD process may be possible.

A radio frequency (RF) plasma CVD process is employed to grow the carbon nano-tubes. The growing condition is as follows, for example. As a reaction gas, a mixed gas of ethane and hydrogen is introduced at flow rates of 40 sccm and 60 sccm, respectively, into a vacuum chamber at a pressure of 200 Pa, and 2.45 GHz microwave power of 2 kw and a substrate temperature of 400° C. are used. A DC electric field of −400 V relative to the chamber (grounded) is applied to the substrate to cause the grown tubes to be vertically oriented. A growing time is set to 30 minutes to acquire a length of the nano-tube of 1 μm. The reaction gas is not limited so long as it contains a carbonaceous gas. An acetylene gas, for example, may be used in place of the methane described above.

A DC plasma/heated filament CVD process using DC plasma in combination with a heated filament may be used besides the plasma CVD process. In such a case, a mixed gas of acetylene and hydrogen at flow rates of 80 sccm and 20 sccm, respectively, is introduced as the reaction gas into the vacuum chamber at a pressure of 1,000 Pa, and a substrate temperature of 600° C. and a heated filament temperature of 1,800° C. are used. A DC electric field of −400 V relative to the chamber (grounded) is applied to the substrate to cause the grown tubes vertically orientated (this means DC plasma).

The growth of the carbon nano-tubes can be made by use of a conventional thermal CVD process or heated filament CVD process. However, when a system used therefor does not have a mechanism for applying the DC electric field, the oriented carbon nano-tubes cannot be obtained and, therefore, such a process is not superior.

The electronic device according to the invention uses the carbon nano-tubes grown from the metal silicide layer formed by converting the catalyst metal necessary for the growth of the carbon nano-tubes to silicide. Therefore, control of the diameter of carbon nano-tubes depending on the composition of the metal silicide layer and improvement of uniformity of the carbon nano-tube diameters become possible. For example, carbon nano-tubes having properties analogous to semiconductors have a band gap dependent on the diameter, and when the nano-tubes having a uniform diameter obtained through composition control of the metal silicide layer are used, it becomes possible to utilize an electronic device in which carbon nano-tubes having a desired band gap are uniformly arranged.

EXAMPLES

The invention will be explained in further detail with reference to Examples thereof, but is in no way limited to the Examples.

Example 1

In this example, a carbon nano-tube was used as an electrode connected to a silicide portion of source/drain regions of a CMOS device formed on a silicon substrate. When the carbon nano-tube has a diameter suitable for a fine via-hole communicating with the silicide portion, miniaturization of the source/drain regions, that is, a device size, can be accomplished. Furthermore, owing to high conductivity of the carbon nano-tube itself, the resistance of the electrode can be much lower than in the case of connection by use of a high-resistance W electrode that has been conventionally used in such a via-hole.

Figure 4A:
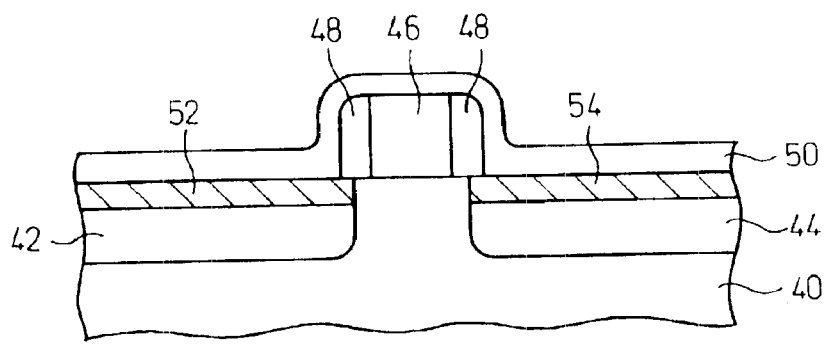
FIGS. 4A to 4C schematically illustrate the production of an electronic device in Example 1.
Figure 4B:
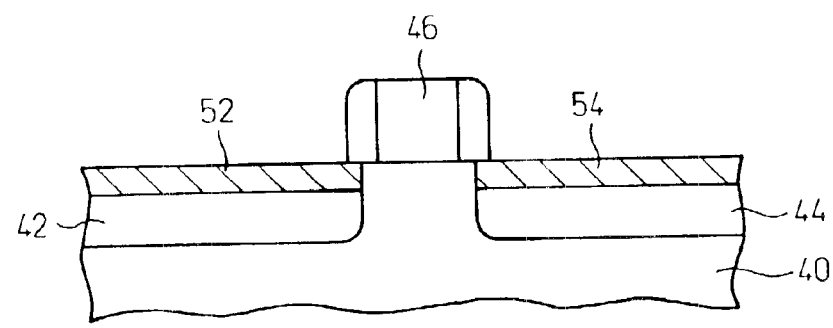

First, a gate electrode structure 46 having insulating film sidewalls 48 of an ordinary structure was formed on a Si substrate 40 having a source region 42 and a drain region 44 as shown in FIG. 4A. A Ni film (35 nm) was then deposited to the entire surface of this silicon substrate 40 by use of a sputtering method. Heat-treatment was then carried out at 500° C. for 30 seconds using an RTA process, and Ni silicide (NiSi) layers 52 and 54 were formed on the surface portions of the source and drain regions 42 and 44. Next, only a non-reacted Ni layer was selectively removed by a wet etching method using an aqueous nitric acid solution ($HNO_3:H_2O =1:10$), as shown in FIG. 4B.

Figure 4C:
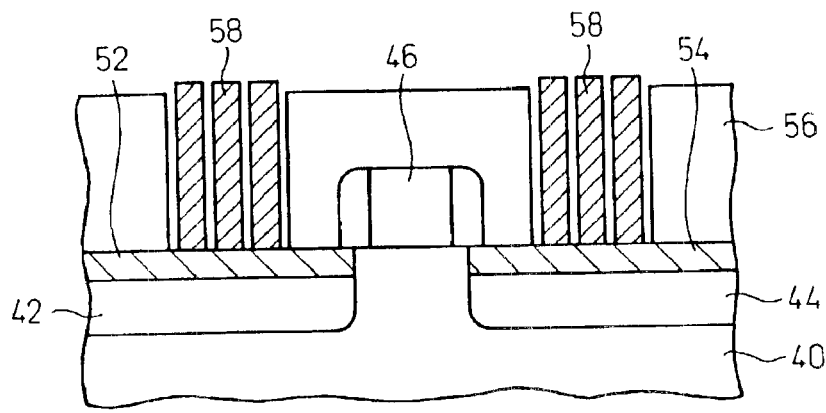

Subsequently, a silicon-based low dielectric constant (low-k) film as an interlayer insulating film 56 was formed to a thickness of 1 $\mu$m by a plasma CVD method on the entire surface of the Si substrate 40, as shown in FIG. 4C. The resulting film 56 was patterned by dry etching using a fluorine-based etching gas to form via-holes reaching the silicide layers 52 and 54. Next, carbon nano-tubes 58 exhibiting the metallic properties were vertically grown on the silicide layers 52 and 54 exposed inside these via-holes. A mixed gas of $CH_4$ and $H_2$ was used for growing the carbon nano-tube 58 at 600° C. and 200 Pa for about 20 minutes. An electric field of −200 V was applied in the vertical direction so as to orient and grow the nano-tubes 58 in the direction vertical to the surface of the Si substrate.

A copper wiring pattern (not shown in the drawings) to be connected to the carbon nano-tubes 58 was thereafter formed.

Example 2

This example was substantially the same as Example 1 with the exception that an ion implantation method was employed to form the silicide portions of the source/drain regions of the CMOS formed on the silicon substrate.

First, a Ni element was implanted into the source and drain regions 42 and 44 of the silicon substrate 40 (FIG. 4) by the ion implantation method at an acceleration voltage of 100 keV and a dose of $1\times10^{17}$ $cm^{-2}$. Thereafter, heat-treatment was conducted at 900° C. for 30 second by use of an RTA method to form a Ni silicide layer on surface layer portions of the source and drain regions 42 and 44.

Subsequently, the interlayer insulating film having the via-holes formed therein was formed following the method explained in Example 1 with reference to FIG. 4C.

The carbon nano-tubes were grown inside the via-holes, and the copper wiring pattern to be connected to the carbon nano-tubes was then formed.

Example 3

In this example, carbon nano-tubes, that operate as channels, are formed in a horizontal direction between the surface layer metal silicide of source/drain regions of a CMOS device formed on a silicon substrate. When single-wall carbon nano-tubes having a small tube diameter are formed by controlling the metal composition of the metal silicide to be reduced, the resulting carbon nano-tubes become those having excellent semiconductor properties and, as ballistic conduction of the carriers can be expected, a fine and high-speed device can be accomplished.

Figure 5A:
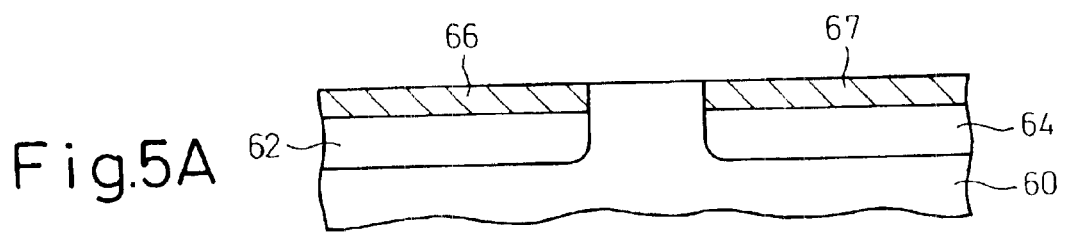
FIGS. 5A to 5D schematically illustrate the production of an electronic device in Example 3.

First, as shown in FIG. 5A, Ni elements are implanted by an ion implantation method into source and drain regions 62 and 64 of an Si substrate 60 at an acceleration voltage of 100 keV and a dose of $1\times10^{17}$ $cm^{-2}$, and heat-treatment is conducted at 900° C. by an RTA method to form Ni silicide layers 66 and 67.

Figure 5B:
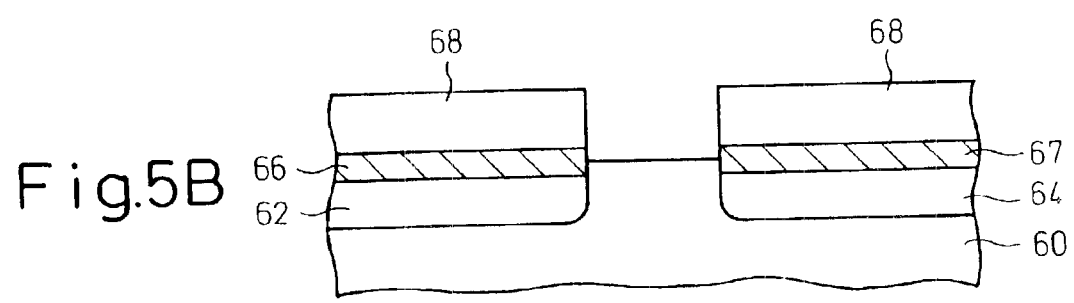

Next, a SiON film is deposited to a thickness of 100 nm by a plasma CVD method to form an insulating film on the entire surface of the substrate. By dry etching using a fluorine-based etching gas, the insulating film 68 is patterned and the silicide layers 66 and 67 are etched away to their intermediate portions as shown in FIG. 5B.

Figure 5C:
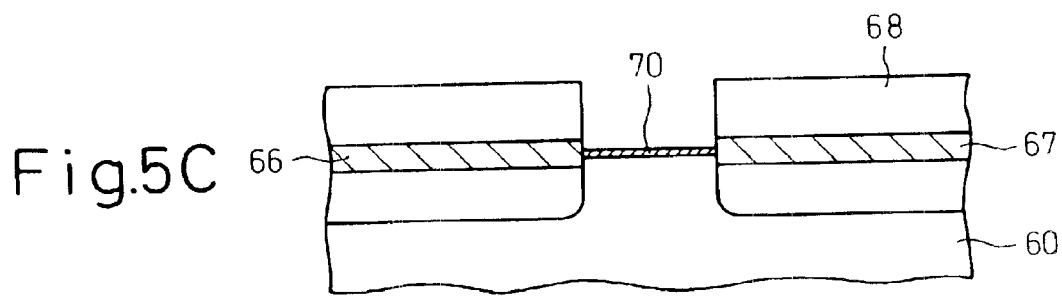

Subsequently, a carbon nano-tube 70 having semiconductor properties is grown in the horizontal direction by a plasma CVD method while an electric field is applied in the horizontal direction between the sidewalls of the silicide layers 66 and 67 exposed on both sides of the opening formed by dry etching as shown in Fig. 5C. The carbon nano-tube so formed can be used as the channel of the device, and an amount of current processed by the device can be controlled in accordance with the number of the carbon nano-tubes formed.

Figure 5D:
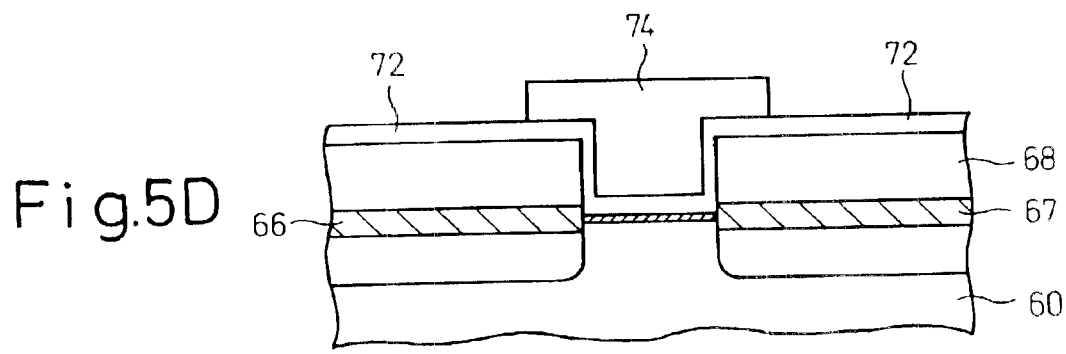

Next, a SiON film is formed to a thickness of 5 to 10 nm by use of a plasma CVD method to form a thin insulating layer 72 over the entire substrate, as shown in FIG. 5D. This insulating film may be a metal oxide film. For example, it is possible to use a thin layer of a metal oxide film formed by evaporating Al, Ti or the like (to a thickness of 1 to 10 nm) and oxidizing it by oxygen plasma or in air (natural oxidation). A resist layer (not shown) is formed on the insulating film thin layer 72 and is patterned to open the resist at the gate electrode portion. Aluminum (Al), for example, is evaporated to a thickness of 300 nm as a gate electrode material. The gate electrode 74 is formed by a subsequent lift-off method.

A lead electrode (not shown) taken out for the connection with an external circuit and formed inside the via-hole (not shown) formed in the insulating film thin layer 72 and in the insulating film 68 below the former in such a manner as to reach the silicide layers 66 and 67 of the source region 62 and the drain region 64, can be formed of the carbon nano-tube in the same way as explained in Example 1 or 2. Alternatively, it is also possible to form a lead electrode from a common material such a tungsten.

The present invention can provide an electronic device having a fine structure and stable characteristics by use of a carbon element linear structure having a uniform diameter. The invention can also provide an electronic device having a fine structure inclusive of wiring elements such as a lead electrode having a lower resistance.

What is claimed is:

1. An electronic device utilizing electric conduction generated by the movement of electrons or positive holes of a semiconductor, including a semiconductor member or members, a conductive member or members and an insulating member or members, comprising:

a member or members formed of a metal silicide as said conductive member or members; and a carbon element linear structure or structures connected directly to said member or members formed of said metal silicide.

2. An electronic device according to claim 1, wherein said metal silicide is a silicide of Ni, Co or Fe, or a silicide of their alloys.

3. An electronic device according to claim 1, wherein said members formed of said metal silicide are positioned at surface layer portions of source and drain regions of a transistor.

4. An electronic device according to claim 3, wherein said carbon element linear structure or structures constitute lead electrodes for connecting said source and drain regions to an external circuit.

5. An electronic device according to claim 3, which further comprises a carbon element linear structure or structures connected to both of said source and drain regions and constitutes a channel of a transistor.

6. An electronic device according to claim 4, which further comprises a carbon element linear structure or structures connected to both of said source and drain regions and constitutes a channel of a transistor.

7. An electronic device according to claim 1, wherein said carbon element linear structure is a carbon nano-tube.

* * * * *